(12) United States Patent
Mitsuishi et al.

(10) Patent No.: US 8,921,878 B2
(45) Date of Patent: *Dec. 30, 2014

(54) LIGHT EMITTING DEVICE

(75) Inventors: Iwao Mitsuishi, Tokyo (JP); Kunio Ishida, Tokyo (JP); Yumi Fukuda, Tokyo (JP); Aoi Okada, Tokyo (JP); Naotoshi Matsuda, Kanagawa (JP); Keiko Albessard, Kanagawa (JP); Shinya Nunoue, Chiba (JP); Masahiro Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 401 days.

This patent is subject to a terminal disclaimer.

(21) Appl. No.: 13/214,572

(22) Filed: Aug. 22, 2011

(65) Prior Publication Data

US 2012/0056225 A1 Mar. 8, 2012

(30) Foreign Application Priority Data

Sep. 7, 2010 (JP) ................................ 2010-199983
Aug. 16, 2011 (JP) ................................ 2011-177808

(51) Int. Cl.
*H01L 33/00* (2010.01)
*H01J 1/62* (2006.01)
(Continued)

(52) U.S. Cl.
CPC .......... *H01L 33/504* (2013.01); *C09K 11/0883* (2013.01); *C09K 11/7734* (2013.01);
(Continued)

(58) Field of Classification Search
CPC ... H01L 33/501; H01L 33/502; H01L 33/504; H01L 33/505; H01L 33/507
USPC ............ 257/98–100, E33.061; 313/483–487, 313/498–503
See application file for complete search history.

(56) References Cited

U.S. PATENT DOCUMENTS 7,884,538 B2    2/2011  Mitsuishi
8,436,527 B2 *  5/2013  Mitsuishi et al. ............. 313/501
(Continued)

FOREIGN PATENT DOCUMENTS

EP  2 003 183 A1  12/2008
JP  2009-59896     3/2009
(Continued)

OTHER PUBLICATIONS

U.S. Appl. No. 13/037,635, filed Mar. 1, 2011, Okada.
(Continued)

*Primary Examiner* — Shouxiang Hu
(74) *Attorney, Agent, or Firm* — Oblon, Spivak, McClelland, Maier & Neustadt, L.L.P.

(57) ABSTRACT

A light emitting device according to one embodiment includes a board; a light emitting element mounted on the board, emitting light having a wavelength of 250 nm to 500 nm; a red fluorescent layer formed on the element, including a red phosphor expressed by equation (1), having a semicircular shape with a diameter r;

$$(M_{1-x1}Eu_{x1})_a Si_b AlO_c N_d \quad (1)$$

(In the equation (1), M is an element that is selected from IA group elements, IIA group elements, IIIA group elements, IIIB group elements except Al (Aliminum), rare-earth elements, and IVB group elements),
an intermediate layer formed on the red fluorescent layer, being made of transparent resin, having a semicircular shape with a diameter D; and a green fluorescent layer formed on the intermediate layer, including a green phosphor, having a semicircular shape. A relationship between the diameter r and the diameter D satisfies equation (2):

$$2.0r(\mu m) \leq D \leq (r+1000)(\mu m). \quad (2)$$

9 Claims, 6 Drawing Sheets

(51) Int. Cl.
*H01L 33/50* (2010.01)
*C09K 11/08* (2006.01)
*C09K 11/77* (2006.01)
*H01L 33/44* (2010.01)
*H01L 33/54* (2010.01)
*H01L 33/56* (2010.01)

(52) U.S. Cl.
CPC ............. *H01L 33/507* (2013.01); *H01L 33/44* (2013.01); *H01L 33/505* (2013.01); *H01L 33/54* (2013.01); *H01L 33/56* (2013.01); *H01L 2224/48091* (2013.01); *H01L 2224/45144* (2013.01)
USPC ........ 257/98; 257/99; 257/100; 257/E33.061; 313/483; 313/501

(56) References Cited

U.S. PATENT DOCUMENTS

| | | | |
|---|---|---|---|
| 2009/0058256 A1* | 3/2009 | Mitsuishi et al. | 313/487 |
| 2009/0096361 A1 | 4/2009 | Fukuda et al. | |
| 2009/0236963 A1 | 9/2009 | Nagatomi et al. | |
| 2010/0025632 A1 | 2/2010 | Fukuda et al. | |
| 2010/0051988 A1 | 3/2010 | Mitsuishi et al. | |
| 2010/0102707 A1 | 4/2010 | Fukuda et al. | |
| 2011/0204769 A1 | 8/2011 | Fukuda et al. | |

FOREIGN PATENT DOCUMENTS

| | | |
|---|---|---|
| JP | 2010-31201 | 2/2010 |
| JP | 2010-106127 | 5/2010 |
| WO | WO 2006/093298 A1 | 9/2006 |
| WO | WO 2009/145298 A1 | 12/2009 |

OTHER PUBLICATIONS

U.S. Appl. No. 13/033,954, filed Feb. 24, 2011, Mitsuishi.
U.S. Appl. No. 13/034,120, filed Feb. 24, 2011, Mitsuishi.
U.S. Appl. No. 13/039,082, filed Mar. 2, 2011, Kato.
U.S. Appl. No. 13/216,860, filed Aug. 24, 2011, Fukuda.
U.S. Appl. No. 13/033,960, filed Feb. 24, 2011, Mitsuishi.
U.S. Appl. No. 13/034,137, filed Feb. 24, 2011, Mitsuishi, et al.
Office Action issued Sep. 20, 2011 in Japanese Application No. 2011-177808 filed Aug. 16, 2011.
Combined Chinese Office Action and Search Report issued Dec. 10, 2013, in Chinese Patent Application No. 201110050912.6 with English translation and English translation of category of cited documents.
Extended European Search Report issued Apr. 2, 2014 in Patent Application No. 11156159.3.

* cited by examiner

LIGHT EMITTING DEVICE

CROSS-REFERENCE TO RELATED APPLICATION

This application is based upon and claims the benefit of priority from Japanese Patent Application No. 2010-199983, filed on Sep. 7, 2010, No. 2011-177808, filed on Aug. 16, 2011; the entire contents of which are incorporated herein by reference.

FIELD

Embodiments described herein relate generally to a light emitting device.

BACKGROUND

Recently, attention focuses on a so-called white-color Light Emitting Device (LED) in which a yellow phosphor such as YAG:Ce is combined with a blue LED to emit white-color light by single chip. Conventionally, the LED emits red, green, or blue light in monochromatic form, and it is necessary that plural LEDs emitting monochrome wavelengths are driven in order to emit the white-color light or intermediate-color light. However, currently, the combination of the light emitting diode and the phosphor removes the trouble to obtain the white-color light with a simple structure.

An LED lamp in which the light emitting diode is used is applied to various display devices of a mobile device, a PC peripheral device, an OA device, various switches, a light source for backlight, and a display board. In the LED lamps, there is a strong demand for high efficiency. Additionally, there is a demand for high color rendering in general-purpose lighting applications, and there is a demand for high color gamut in LCD TV backlight applications. High efficiency of the phosphor is required for the purpose of the high efficiency of the LED lamp, and a white-color light source in which a phosphor emitting blue excitation light, a phosphor excited by blue light to emit green light, and a phosphor excited by blue light to emit red light are combined is preferable to the high color rendering and the high color gamut.

The high-power LED generates heat by drive, and generally the phosphor is heated up to about 100 to about 200° C. When the temperature rise is generated, generally emission intensity of the phosphor is degraded to generate so-called thermal quenching. Therefore, unfortunately the luminous efficiency is degraded particularly in a high-temperature range, that is, a high-current range.

Additionally, when plural phosphors are used, unfortunately the luminous efficiency is degraded by reabsorption between phosphors.

DETAILED DESCRIPTION

A light emitting device according to one embodiment includes a board; a light emitting element mounted on a principal surface of the board, the light emitting element emitting light having a wavelength of 250 nm to 500 nm; a red fluorescent layer formed on the light emitting element, the red fluorescent layer including a red phosphor expressed by equation (1), an outer circumference of the red fluorescent layer having a semicircular shape with a diameter r in a section perpendicular to the principal surface;

$$(M_{1-x1}Eu_{x1})_a Si_b AlO_c N_d \qquad (1)$$

(In the equation (1), M is an element that is selected from IA group elements, IIA group elements, IIIA group elements, IIIB group elements except Al (Aliminum), rare-earth elements, and IVB group elements, and x1, a, b, c, and d satisfy the following relationship:

$0 < x1 < 1$, $0.55 < a < 0.95$, $2.0 < b < 3.9$, $0 < c < 0.6$, $4 < d < 5.7$)

an intermediate layer formed on the red fluorescent layer, the intermediate layer being made of transparent resin, an outer circumference of the intermediate layer having a semicircular shape with a diameter D in a section perpendicular to the principal surface; and a green fluorescent layer formed on the intermediate layer, the green fluorescent layer including a green phosphor, an outer circumference of the green fluorescent layer having a semicircular shape in a section perpendicular to the principal surface. A relationship between the diameter r and the diameter D satisfies equation (2):

$$2.0r(\mu m) \leq D \leq (r+1000)(\mu m). \qquad (2)$$

Embodiments will be described below with reference to the drawings.

As used herein, the red phosphor means a phosphor that emits light ranging from an orange color to a red color (hereinafter also collectively referred to as red color), that is, light having a peak at the wavelength of 580 to 700 nm, which is longer than the excitation light, when the phosphor is excited by the light having the wavelength of 250 nm to 500 nm, that is, the near-ultraviolet light or the blue light.

As used herein, the green phosphor means a phosphor that emits light ranging from a blue-green color to a yellow-green color (hereinafter also collectively referred to as green color), that is, light having a peak at the wavelength of 490 to 550 nm, which is longer than the excitation light, when the phosphor is excited by light having the wavelength of 250 nm to 500 nm, that is, the near-ultraviolet light or the blue light.

As used herein, the "white-color light" means a concept including a light bulb color, a warm white color, a white color, a day white light, and a day light color, in which pieces of light having different wavelengths used generally in the lighting device are mixed.

First Embodiment

A light emitting device according to a first embodiment includes the board that includes the principal surface on which the light emitting element is mounted; the light emitting element that is mounted on the principal surface to emit the light having the wavelength of 250 nm to 500 nm; the red fluorescent layer that is formed on the light emitting element to include the red phosphor expressed by the equation (1), the outer circumference being formed into the semicircular shape having the diameter r in the section perpendicular to the principal surface;

$$(M_{1-x1}Eu_{x1})_a Si_b AlO_c N_d \qquad (1)$$

(In the equation (1), M is an element that is selected from IA group elements, IIA group elements, IIIA group elements, IIIB group elements except Al (Aliminum), rare-earth elements, and IVB group elements. x1, a, b, c, and d satisfy the following relationship.

$0<x1<1$, $0.55<a<0.95$, $2.0<b<3.9$, $0<c<0.6$, $4<d<5.7$)

the transparent resin intermediate layer that is formed on the red fluorescent layer, the outer circumference being formed into the semicircular shape having the diameter D in the section perpendicular to the principal surface; and the green fluorescent layer that is formed on the intermediate layer to include the green phosphor, the outer circumference being formed into the semicircular shape in the section perpendicular to the principal surface. A relationship between the diameter r and the diameter D satisfies equation (2).

$$2.0r(\mu m) \leq D \leq (r+1000)(\mu m) \qquad (2)$$

The sialon phosphor having the composition expressed by the equation (1) is a red phosphor (R). The red phosphor (R) emits the light ranging from the orange color to the red color, that is, the light having the peak at the wavelength of 580 to 700 nm, which is longer than the excitation light, when the red phosphor (R) is excited by the light having the wavelength of 250 nm to 500 nm, that is, the near-ultraviolet light or the blue light.

Because of the small thermal quenching, the red phosphor obtains the excellent luminous efficiency even in a high temperature region. At the same time, an excitation spectrum of the red phosphor becomes extensive from the near-ultraviolet light to the green light. Therefore, when the white-color light emitting device (white-color LED) is formed by a combination of the red phosphor and the green phosphor, the red phosphor significantly reabsorbs the green light to possibly generate the degradation of the luminous efficiency or the color shift.

In the light emitting device of the first embodiment, the transparent resin intermediate layer is provided between the red fluorescent layer and the green fluorescent layer, and the diameters of the red fluorescent layer and intermediate layer are restricted. Therefore, the reabsorption of the green light by the sialon red phosphor is suppressed to implement the white-color light emitting device, in which the luminous efficiency is increased and the color shift is suppressed.

Figure 1:
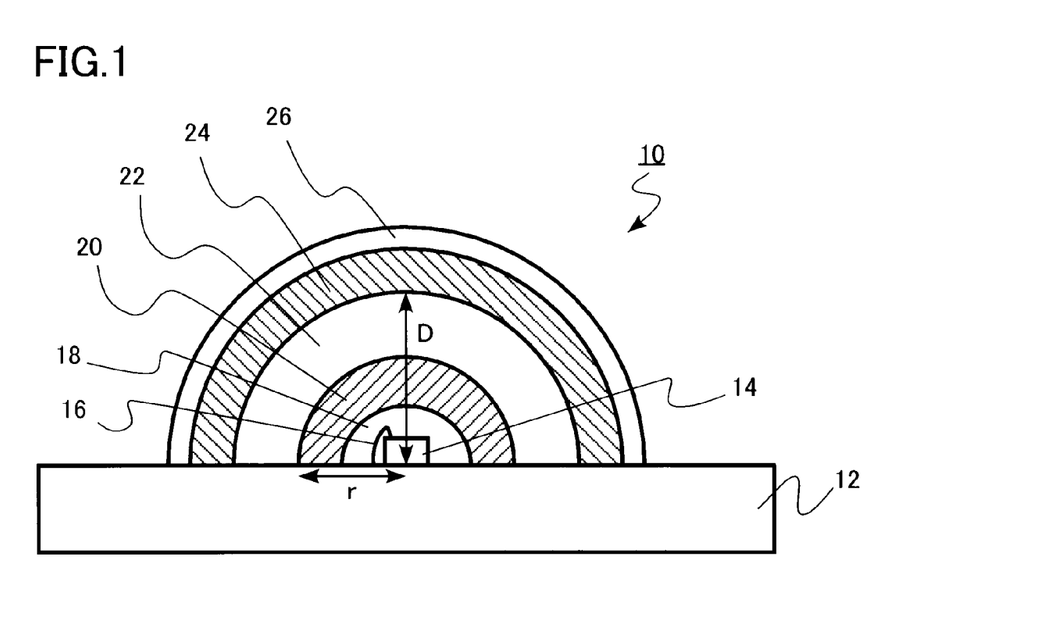
FIG. 1 is a schematic sectional view illustrating a light emitting device according to a first embodiment.

FIG. 1 is a schematic sectional view illustrating the light emitting device of the first embodiment. A light emitting device 10 is a white-color LED that emits the white-color light. The light emitting device 10 includes a board 12 that includes the principal surface on which the light emitting element is mounted. For example, the board 12 is made of a highly-reflective material. The principal surface means a plane in an upper surface of the board.

For example, the blue LED chip that is a light emitting element 14 is mounted on the principal surface of the board 12, and the light emitting element 14 emits the light having the wavelength of 250 nm to 500 nm. For example, the blue LED chip is connected to wiring (not illustrated) through a gold wire 16. Driving currents are supplied to the blue LED chip from the outside through the wiring, whereby the blue LED chip emits the blue light for excitation.

A hemispherical element sealing transparent layer 18 made of a transparent resin is provided on the light emitting element 14. For example, a silicone resin is used as the transparent resin.

A red fluorescent layer 20 is formed such that the element sealing transparent layer 18 is covered therewith. The outer circumference of the red fluorescent layer 20 is formed into the semicircular shape having the diameter r in the section perpendicular to the principal surface. The red fluorescent layer 20 includes the red phosphor having a composition expressed by the equation (1).

$$(M_{1-x1}Eu_{x1})_a Si_b AlO_c N_d \qquad (1)$$

(In the equation (1), M is an element that is selected from IA group elements, IIA group elements, IIIA group elements, IIIB group elements except Al, rare-earth elements, and IVB group elements. x1, a, b, c, and d satisfy the following relationship.

$0<x1<1$, $0.55<a<0.95$, $2.0<b<3.9$, $0<c<0.6$, $4<d<5.7$)

Desirably, the element M is Sr (Strontium). The element M may include other elements such as Ca (Calsium) less than or equal to around 10 mol % in addition to Sr.

For example, the red fluorescent layer 20 is formed while the red phosphor is dispersed in a transparent silicone resin. The red fluorescent layer 20 absorbs the blue light emitted from the blue LED and converts the blue light into the red light.

A transparent resin intermediate layer 22 is formed on the red fluorescent layer 20. The outer circumference of the intermediate layer 22 is formed into the semicircular shape having the diameter D in the section perpendicular to the principal surface of the board 12. For example, a silicone resin is used as the transparent resin.

A green fluorescent layer 24 including the green phosphor is formed such that the intermediate layer 22 is covered therewith, and the outer circumference of the green fluorescent layer 24 is formed into the semicircular shape in the section perpendicular to the principal surface. The reabsorption by the red fluorescent layer 20 is suppressed by providing the intermediate layer 22.

For example, the green fluorescent layer 24 is formed while the green phosphor is dispersed in the transparent silicone resin. The green fluorescent layer 24 absorbs the blue light emitted from the blue LED and converts the blue light into the green light.

An outer surface transparent layer (outer surface layer) 26 made of, for example, the transparent silicone resin, is formed such that the green fluorescent layer 24 is covered therewith. The green fluorescent layer 26 has a function of suppressing total reflection of the pieces of light, which are emitted from the light emitting element 14, the red fluorescent layer 20, and the green fluorescent layer 24, at an interface with an atmosphere.

Thus, the light emitting device 10 includes the red fluorescent layer 20, intermediate transparent layer 22 made of transparent resin, and green fluorescent layer 24, which are stacked into the hemispherical shape on the light emitting element 14. The light emitting device 10 emits the white-color light having the high emission intensity and high coloring homogeneity by forming the fluorescent layers into the hemispherical shape.

The relationship between the diameter r outside the red fluorescent layer 20 and the diameter D outside the intermediate layer 22 satisfies the following equation (2).

$$2.0r(\mu m) \leq D \leq (r+1000)(\mu m) \tag{2}$$

The red fluorescent layer 20 and the intermediate layer 22 are permitted to deviate from the perfect hemispherical shape due to factors on the production, for example. In such cases, the diameter r or the diameter D may be computed by averaging a diameter in a direction perpendicular to the principal surface of the board 12 and a diameter in a direction parallel to the principal surface of the board 12.

Next, function of the light emitting device 10 will be described.

Figure 2:
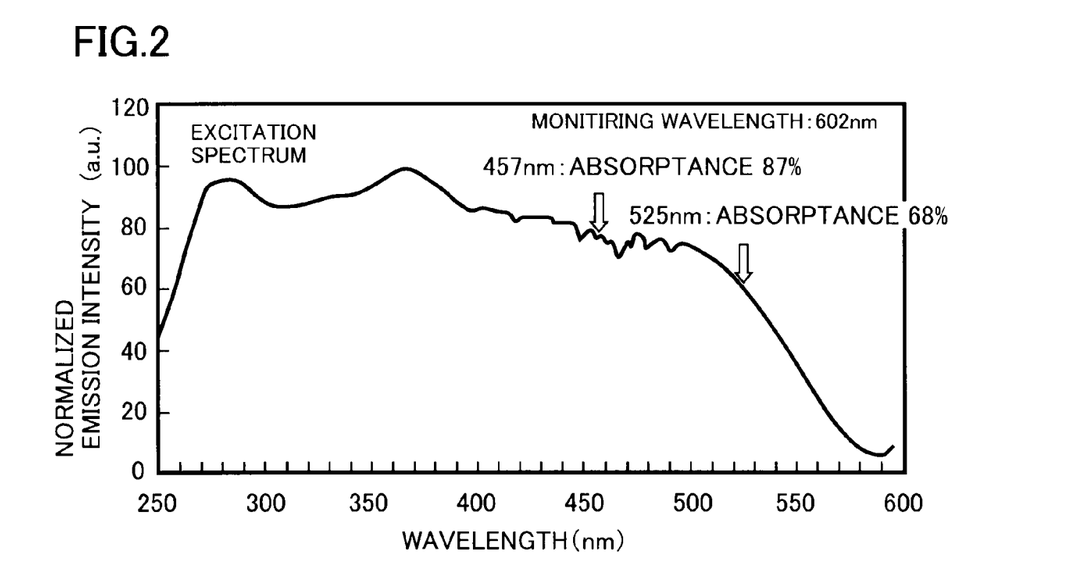
FIG. 2 is a view illustrating an absorptance of a red phosphor of the first embodiment.

FIG. 2 is a view illustrating normalized emission intensity of the sialon red phosphor having the composition expressed by the equation (1). In FIG. 2, a horizontal axis indicates a wavelength of excitation light, and a vertical axis indicates the normalized emission intensity at a monitoring wavelength of 602 nm.

An absorptance of 87% at the wavelength of 457 nm is determined from an emission property evaluation when the excitation is performed by the blue LED having the peak wavelength of 457 nm. The absorptance of 68% of the green light at the wavelength of 525 nm is determined by a proportional distribution from the absorptance of 87% and the property of FIG. 2. Hereinafter an absorptance $\beta$ of the green light by the red phosphor of the first embodiment is representatively discussed by the value of 0.68.

Practically a luminous flux loss caused by the reabsorption of the green light by the red fluorescent layer 20 is desirably set to 5% or less from the viewpoint of the property of the light emitting device. The relationship required for the diameter r outside the red fluorescent layer 20 and the diameter D outside the intermediate layer 22 will be derived in order to satisfy the condition that the luminous flux loss is 5% or less.

Figure 3:
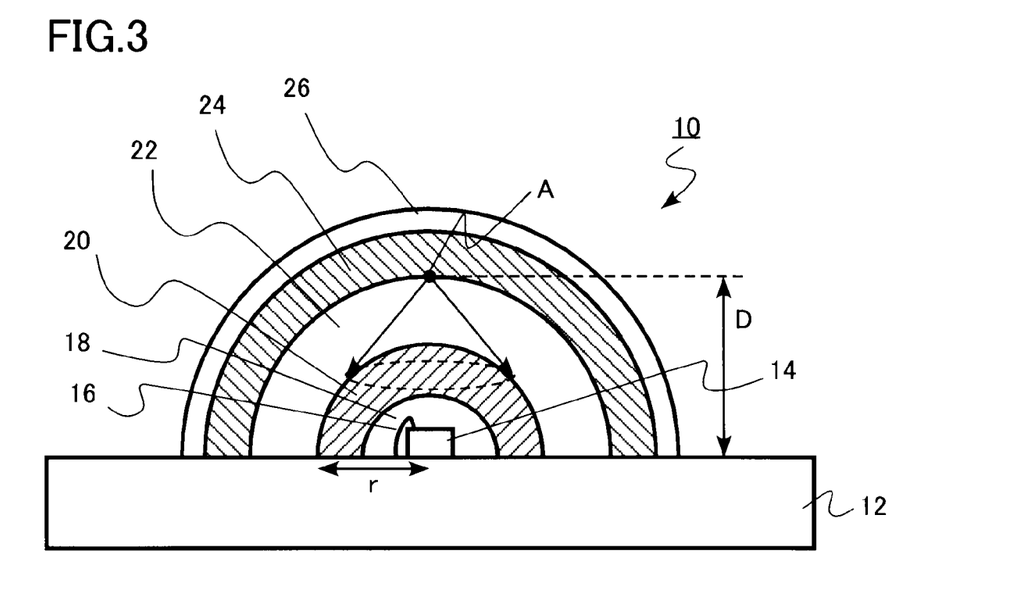
FIG. 3 is a view illustrating function of the light emitting device of the first embodiment.

FIG. 3 is an explanatory view of action of the light emitting device of the first embodiment. For example, the green light emitted from a position A in the green fluorescent layer 24 spread all around as illustrated in FIG. 3. In FIG. 2, a luminous flux in a range conceptually indicated by two arrows and a dotted-line ellipsoid, that is, a luminous flux in a range where the red fluorescent layer is seen from the position A becomes a luminous flux that is possibly absorbed by the red fluorescent layer 20.

A ratio $L_2/L_1$ of a luminous flux $L_2$ (the luminous flux that is possibly absorbed by the red fluorescent layer 20) reaching the outer surface of the red fluorescent layer 20 to a total luminous flux $L_1$ from the green fluorescent layer 24 is expressed by the following equation (4).

$$L_2/L_1 = 2\pi(1-(1-(r/D)^2)^{-1/2})/2\pi \tag{4}$$
$$= 1-(1-(1-(r/D)^2)^{-1/2})$$

A luminous flux loss $\gamma$ generated by the reabsorption of the green light by the red fluorescent layer 20 is expressed by a product of the absorptance $\beta$ (=0.68) of the green light by the red phosphor, the ration $L_2/L_1$, and a luminous factor difference $\delta$ (=0.63) between the green light (wavelength of 525 nm) and the red light (wavelength of 600 nm). That is, the luminous flux loss $\gamma$ is expressed by the following equation (5).

$$\gamma = \beta\delta(1-(1-(1-(r/D)^2)^{-1/2})) \tag{5}$$

Figure 4:
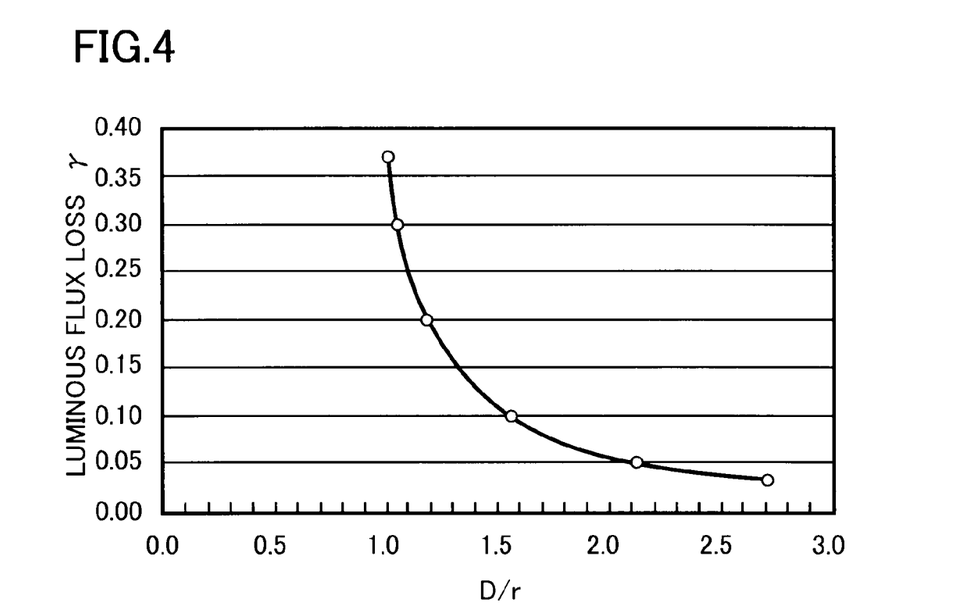
FIG. 4 is a view illustrating a luminous flux loss of the light emitting device of the first embodiment.

FIG. 4 is a graph illustrating the luminous flux loss of the light emitting device of the first embodiment. In FIG. 4, the horizontal axis indicates D/r, and the vertical axis indicates the luminous flux loss $\gamma$ computed from the equation (4). At this pint, computation is performed using $\beta$=0.68 and $\delta$=0.63.

As is clear from FIG. 4, in order to obtain the luminous flux loss $\gamma$ of 5% or loss, desirably D/r is not lower than 2.0 and more desirably D/r is not lower than 2.2. Therefore, desirably the following equation (6) is satisfied. When D/r is not lower than 2.0, a tendency to saturate the luminous flux loss becomes preferably prominent.

$$2.0r(\mu m) \leq D(\mu m) \tag{6}$$

However, when the intermediate layer 22 is excessively thickened, the luminous flux loss caused by the absorption by the intermediate layer 22 becomes obvious to possibly lose the effect that the diameters of the red fluorescent layer 20 and intermediate layer 22 are restricted. The silicone resin that is the typical transparent resin has a transmittance of 90% in a range of the near-ultraviolet light to the blue light with respect to a resin plate having a thickness of 2000 μm. That is, the absorptance is 10%.

It is necessary that a the thickness (D−r) of the intermediate layer 22 satisfy the following equation (7) in order to suppress the luminous flux loss, caused by the absorption of the excitation light or the phosphor emission in the intermediate layer 22, to 5% or less.

$$(D-r) \leq 1000(\mu m) \tag{7}$$

In order to suppress the effect of the intermediate layer 22, desirably the thickness (D−r) of the intermediate layer 22 is 500 μm or less, more desirably the thickness (D−r) is 200 μm or less.

Accordingly, in the light emitting device, it is necessary that the diameter r outside the red fluorescent layer 20 and the diameter D outside the intermediate layer 22 satisfies the following equation (2) from the equation (6) and the equation (7) in order that the absorption losses by the red fluorescent layer 20 and the intermediate layer 22 is suppress to the practically-required value of 5% or less.

$$2.0r(\mu m) \leq D \leq (r+1000)(\mu m) \tag{2}$$

Therefore, the first embodiment implements the light emitting device in which the reabsorption of the green light by the red fluorescent layer is suppressed exert the excellent luminous efficiency while the red phosphor having the small thermal quenching is used.

In the light emitting device of the first embodiment, desirably the green phosphor has the composition expressed by the following equation (3).

$$(M'_{1-x2}Eu_{x2})_{3-y}Si_{13-z}Al_{3+z}O_{2+u}N_{21-w} \quad (3)$$

(In the equation (3), M' is an element that is selected from IA group elements, IIA group elements, IIIA group elements, IIIB group elements except Al, rare-earth elements, and IVB group elements. x2, y, z, u, and w satisfy the following relationship.

$0<x2<1,$ $-0.1<y<0.3,$ $-3<z\leq1,$ $-3<u-w\leq1.5)$

The sialon phosphor having the composition expressed by the equation (3) is a green phosphor (G). The green phosphor (G) emits the light ranging from the blue-green color to the yellow-green color, that is, the light having the peak at the wavelength of 490 to 580 nm, which is longer than the excitation light, when the green phosphor (G) is excited by the light having the wavelength of 250 nm to 500 nm, that is, the near-ultraviolet light or the blue light.

The green phosphor (G) has the small thermal quenching to realize the excellent luminous efficiency particularly in a high temperature region. Accordingly the high-efficiency light emitting device having the better thermal quenching property can be implemented.

Desirably, the element M' is Sr (Strontium). The element M' may include other elements such as Ca (Calsium) less than or equal to around 10 mol % in addition to Sr.

Figure 7:
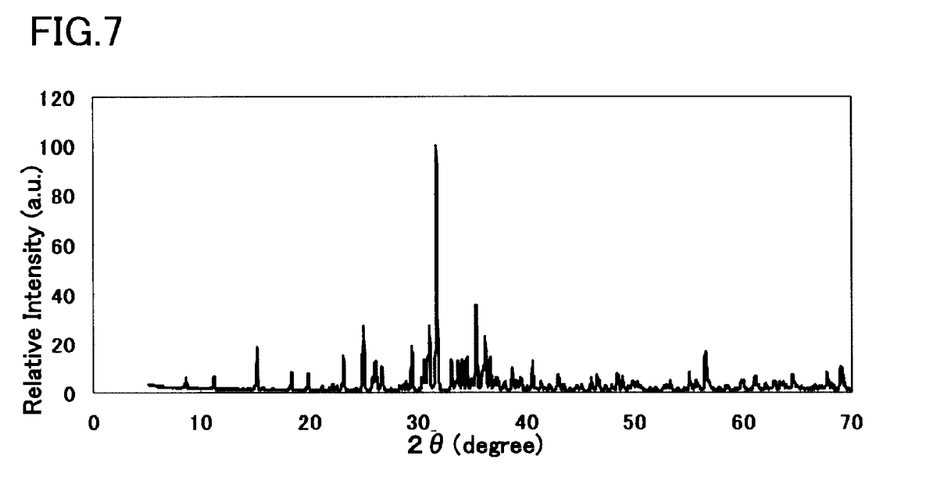
FIG. 7 is a XRD profile of the red phosphor of the example 21.
Figure 8:
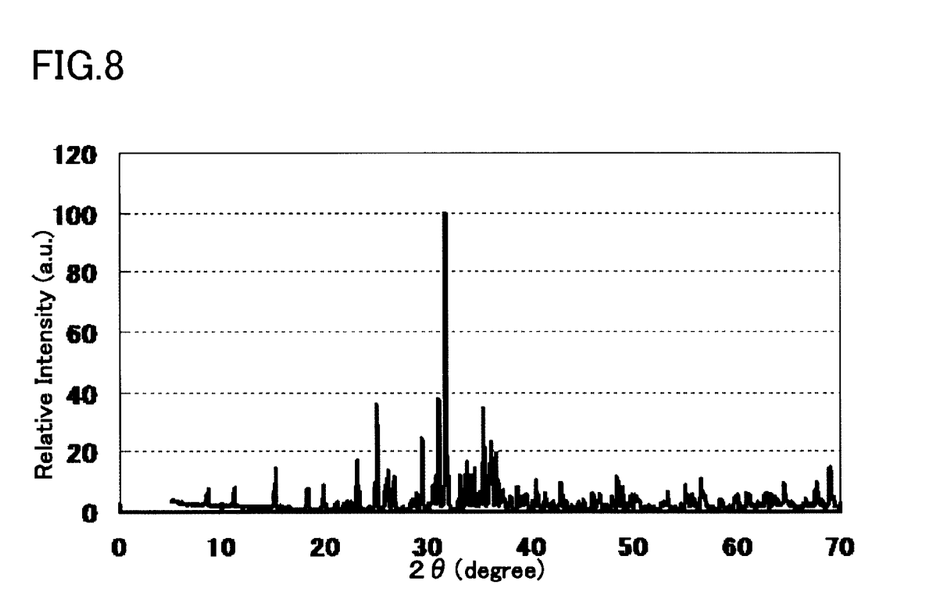
FIG. 8 is a XRD profile of the red phosphor of the example 23.

The red phosphors expressed by the above-described equation (2) of the embodiments have orthorhombic crystal structure. As shown in FIGS. 7, 8, the red phosphors include a component which shows diffraction peaks in at least 9 diffraction degree (2 θ (two theta)) ranges simultaneously among 11 ranges listed below under X-ray diffraction analysis using CuKα characteristic X-ray (wave length of 1.54056 angstroms). The 11 diffraction degree (2 θ (two theta)) ranges are, 31.6-31.8°, 30.9-31.1°, 24.85-25.05°, 35.25-35.45°, 15.0-15.25°, 56.4-56.65°, 36.1-36.25°, 33.0-33.20°, 23.1-23.20°, 29.3-29.6°, 26.95-26.15°.

Figure 9:
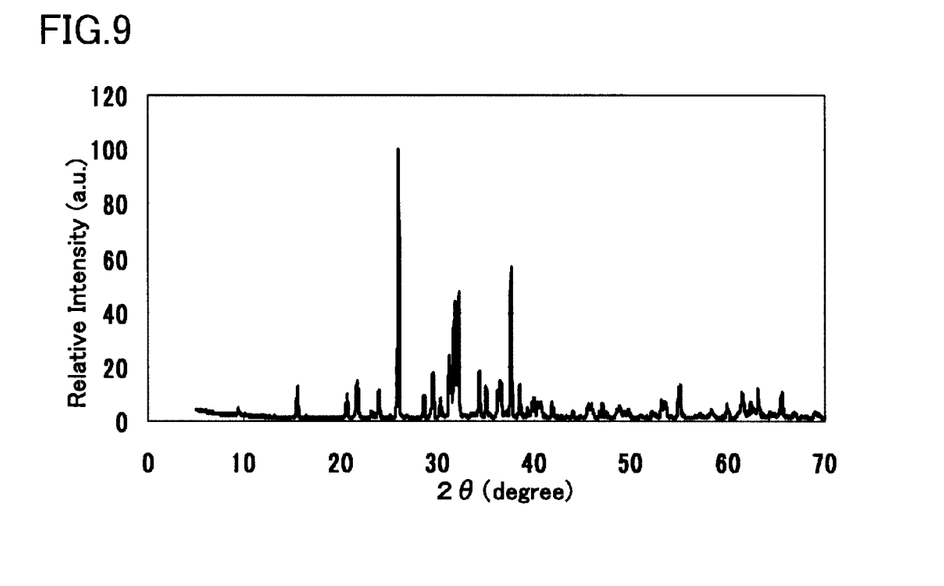
FIG. 9 is a XRD profile of the green phosphor of the example 3.
Figure 10:
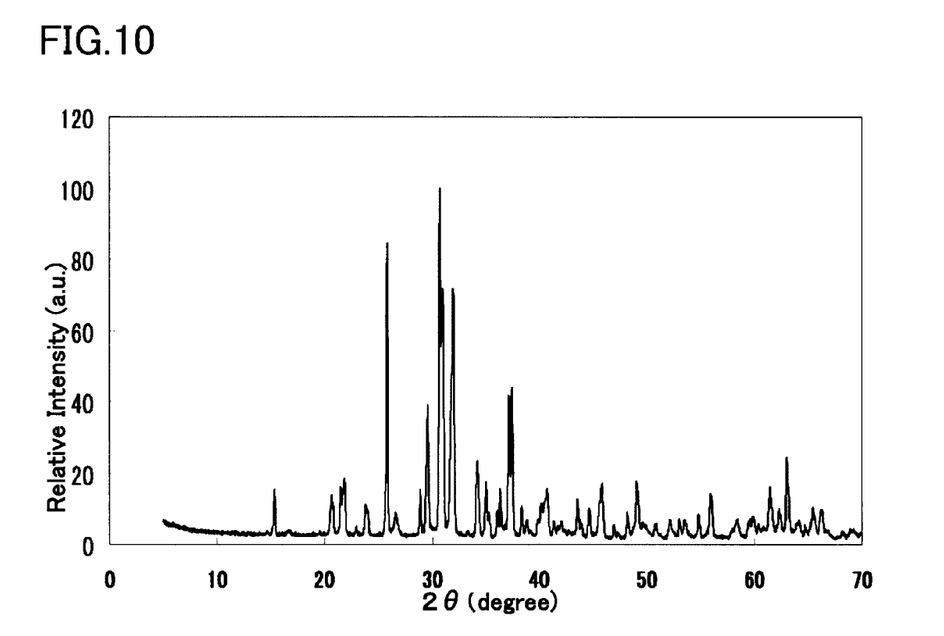
FIG. 10 is a XRD profile of the green phosphor of the example 6.

And the green phosphors expressed by the above-described equation (3) of the embodiments have orthorhombic crystal structure. As shown in FIGS. 9, 10, the green phosphors include a component which shows diffraction peaks in at least 6 diffraction degree (2 θ (two theta)) ranges simultaneously among 15 ranges listed below under X-ray diffraction analysis using CuKα characteristic X-ray (wave length of 1.54056 angstroms). The 15 diffraction degree (2 θ (two theta)) ranges are, 30.5-30.9°, 25.6-30.0°, 31.8-32.2°, 37.2-37.6°, 37.0-37.4°, 29.3-29.7°, 34.0-34.4°, 21.7-22.1°, 48.9-49.3°, 45.7-46.1°, 62.8-63.2°, 15.2-15.6°, 61.3-61.7°, 40.5-40.9°, 55.8°-56.2°.

Second Embodiment

The blue LED is used in the light emitting element of the first embodiment. On the other hand, a near-ultraviolet LED is used in a light emitting element according to a second embodiment, and the light emitting device of the second embodiment includes a blue fluorescent layer. Therefore, the descriptions of the contents overlapped with those of the first embodiment are omitted.

Figure 5:
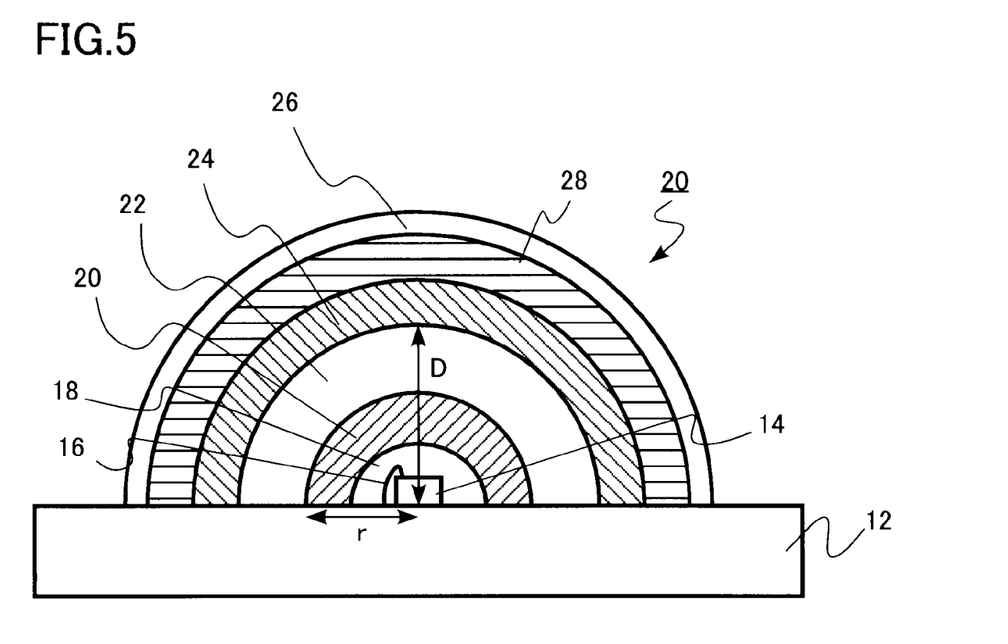
FIG. 5 is a schematic sectional view illustrating a light emitting device according to a second embodiment.

FIG. 5 is a schematic sectional view illustrating the light emitting device of the second embodiment. A light emitting device 20 is a white-color LED that emits the white-color light. In the light emitting device 20, the light emitting element 14 is the near-ultraviolet LED that emits near-ultraviolet light. A blue fluorescent layer 28 is further formed between the green fluorescent layer 24 and the outer surface transparent layer 26.

For example, the blue fluorescent layer 28 is formed while a blue phosphor is dispersed in a transparency silicone resin. The blue fluorescent layer 28 absorbs the near-ultraviolet light emitted from the near-ultraviolet LED and converts the near-ultraviolet light into blue light.

Other configurations of the second embodiment are similar to those of the first embodiment. In the light emitting device of the second embodiment, similar to the first embodiment, the reabsorption of the green light by the red fluorescent layer is suppressed exert the excellent luminous efficiency while the red phosphor having the small thermal quenching is used.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, a semiconductor light emitting element that emits the near-ultraviolet light or the blue light may be used as the light emitting element that emits the excitation light used in the light emitting device. For example, a gallium nitride compound semiconductor can be used as the LED.

In the embodiments, the intermediate layer is directly formed on the red fluorescent layer by way of example. Alternatively, for example, a yellow fluorescent layer including a yellow phosphor may be formed between the red fluorescent layer and the intermediate layer.

It is desirable to form the element sealing transparent layer and the outer surface transparent layer. However, it is not always necessary to form the element sealing transparent layer and the outer surface transparent layer. One of or both the element sealing transparent layer and the outer surface transparent layer may be omitted.

Any binder resin can be used as the binder resin that constitutes the base material of the sealing resin as long as the binder resin is substantially transparent in the neighborhood of the peak wavelength of the light emitting element (excitation element) and the wavelength range longer than the peak wavelength of the light emitting element. Generally examples of the binder resin include a silicone resin, an epoxy resin, a polydimethylcyclohexan derivative having an epoxy group, an oxetane resin, an acrylic resin, a cycloolefin resin, a urea resin, a fluorine resin, and a polyimide resin.

EXAMPLES

Examples 1 to 5

Figure 6:
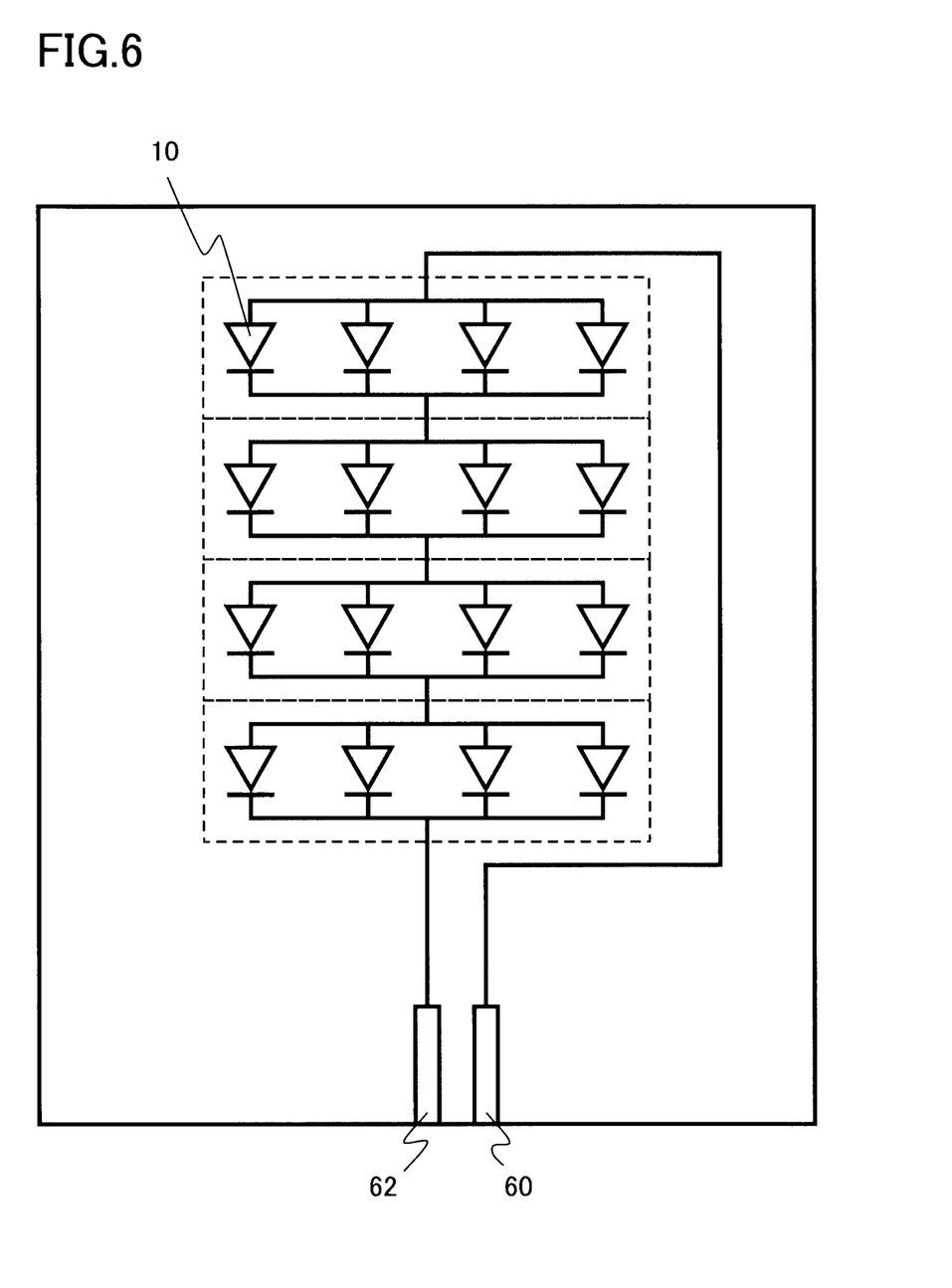
FIG. 6 is a wiring diagram of a white-color light emitting module of Examples.

FIG. 6 is a wiring diagram of a white-color light emitting module of Examples. The light emitting devices 10 of the first embodiment illustrated in FIG. 1 were connected so as to become a 4-by-4 array illustrated in FIG. 6, and an anode electrode 60 and a cathode electrode 62 were formed.

The sialon phosphors having compositions of TABLE 1 were applied to the red phosphor, and the sialon phosphors were expressed by a composition formula of the following equation (8).

$$(Sr_{1-x1}Eu_{x1})_a Si_b AlO_c N_d \quad (8)$$

The sialon phosphors having compositions of TABLE 2 were applied to the green phosphor, and the sialon phosphors were expressed by a composition formula of the following equation (9)

$$(Sr_{1-x2}Eu_{x2})_{3-y}Si_{13-z}Al_{3+z}O_{2+u}N_{21-w} \quad (9)$$

The diameter r outside the red fluorescent layer was set to 105 μm, and the diameter D outside the intermediate layer was set to 410 μm. The diameter r and the diameter D satisfy the equation (2).

$$2.0r=210(\mu m) \leq D=410(\mu m) \leq r+1000=1105(\mu m)$$

The white-color light emitting module was driven at 20 mA, and the luminous efficiency was evaluated by the total luminous flux using the integrating sphere. TABLE 3 illustrates the result.

TABLE 1

| | x1 | a | b | c | d | Peak wavelength (nm) |
|---|---|---|---|---|---|---|
| Example 1 | 0.100 | 0.858 | 3.340 | 0.350 | 4.920 | 622 |
| Example 2 | 0.110 | 0.935 | 3.410 | 0.418 | 5.180 | 631 |
| Example 3 | 0.150 | 0.911 | 3.700 | 0.272 | 5.630 | 642 |
| Example 4 | 0.080 | 0.680 | 2.540 | 0.332 | 4.290 | 616 |
| Example 5 | 0.090 | 0.680 | 2.540 | 0.332 | 4.290 | 616 |
| Example 6 | 0.05 | 0.62 | 2.36 | 0.16 | 4.48 | 641 |
| Example 7 | 0.05 | 0.63 | 2.33 | 0.17 | 4.48 | 636 |
| Example 8 | 0.037 | 0.68 | 2.64 | 0.16 | 4.86 | 634 |
| Example 9 | 0.036 | 0.59 | 2.32 | 0.16 | 4.41 | 632 |
| Example 10 | 0.038 | 0.68 | 2.60 | 0.19 | 4.86 | 630 |
| Example 11 | 0.100 | 0.858 | 3.340 | 0.350 | 4.920 | 622 |
| Example 12 | 0.110 | 0.935 | 3.410 | 0.418 | 5.180 | 631 |
| Example 13 | 0.150 | 0.911 | 3.700 | 0.272 | 5.630 | 642 |
| Example 14 | 0.080 | 0.680 | 2.540 | 0.332 | 4.290 | 616 |
| Example 15 | 0.090 | 0.680 | 2.540 | 0.332 | 4.290 | 616 |
| Example 16 | 0.100 | 0.858 | 3.340 | 0.350 | 4.920 | 622 |
| Example 17 | 0.110 | 0.935 | 3.410 | 0.418 | 5.180 | 631 |
| Example 18 | 0.150 | 0.911 | 3.700 | 0.272 | 5.630 | 642 |
| Example 19 | 0.080 | 0.680 | 2.540 | 0.332 | 4.290 | 616 |
| Example 20 | 0.090 | 0.680 | 2.540 | 0.332 | 4.290 | 616 |
| Example 21 | 0.100 | 0.858 | 3.340 | 0.350 | 4.920 | 622 |
| Example 22 | 0.110 | 0.935 | 3.410 | 0.418 | 5.180 | 631 |
| Example 23 | 0.150 | 0.911 | 3.700 | 0.272 | 5.630 | 642 |
| Example 24 | 0.080 | 0.680 | 2.540 | 0.332 | 4.290 | 616 |
| Example 25 | 0.090 | 0.680 | 2.540 | 0.332 | 4.290 | 616 |

TABLE 2

| | x2 | y | z | u | w | Peak wavelength (nm) |
|---|---|---|---|---|---|---|
| Example 1 | 0.100 | −0.080 | 0.107 | −0.043 | 1.427 | 524 |
| Example 2 | 0.080 | −0.063 | 0.125 | 0.219 | 0.063 | 518 |
| Example 3 | 0.100 | −0.082 | 0.030 | −0.061 | 0.091 | 520 |
| Example 4 | 0.070 | −0.066 | −0.232 | −0.035 | 0.792 | 511 |
| Example 5 | 0.080 | −0.062 | −0.148 | 0.111 | −0.105 | 516 |
| Example 6 | 0.018 | −0.085 | −0.962 | −0.553 | 0.618 | 519 |
| Example 7 | 0.018 | −0.125 | −1.236 | −0.712 | −0.627 | 519 |
| Example 8 | 0.016 | −0.143 | −1.456 | −0.919 | −0.467 | 521 |
| Example 9 | 0.025 | −0.101 | −1.210 | −0.711 | −0.745 | 521 |
| Example 10 | 0.025 | −0.101 | −1.210 | −0.711 | −0.745 | 521 |
| Example 11 | $(Ba_{0.2}Sr_{0.8})_2 SiO_4:Eu^{2+}$ | | | | | 525 |

TABLE 2-continued

| | x2 | y | z | u | w | Peak wavelength (nm) |
|---|---|---|---|---|---|---|
| Example 12 | | | | | | |
| Example 13 | | | | | | |
| Example 14 | | | | | | |
| Example 15 | | | | | | |
| Example 16 | 0.100 | −0.080 | 0.107 | −0.043 | 1.427 | 517 |
| Example 17 | 0.080 | −0.063 | 0.125 | 0.219 | 0.063 | 518 |
| Example 18 | 0.100 | −0.082 | 0.030 | −0.061 | 0.091 | 519 |
| Example 19 | 0.070 | −0.066 | −0.232 | −0.035 | 0.792 | 520 |
| Example 20 | 0.080 | −0.062 | −0.148 | 0.111 | −0.105 | 521 |
| Example 21 | $(Ba_{0.2}Sr_{0.8})_2 SiO_4:Eu^{2+}$ | | | | | 525 |
| Example 22 | | | | | | |
| Example 23 | | | | | | |
| Example 24 | | | | | | |
| Example 25 | | | | | | |

Comparative Examples 1 to 5

The white-color light emitting modules were produced and evaluated similarly to Examples 1 to 5 except that the green fluorescent layer was directly formed on the red fluorescent layer while the intermediate layer was not formed. TABLE 3 illustrates the result.

Comparative Examples 6 to 10

The white-color light emitting modules were produced and evaluated similarly to Examples 1 to 5 except that the diameter D outside the intermediate layer was set to 2150 μm. TABLE 3 illustrates the result. The diameter r and the diameter D do not satisfy the equation (2).

$$2.0r=210(\mu m) \leq D=2150(\mu m) \geq r+1000=1105(\mu m)$$

TABLE 3

| Luminous efficiency Examples Comparative examples | |
|---|---|
| | Luminous efficiency (lm/W) |
| Examples 1-10 | 52~54 |
| Comparative examples 1-5 | 48~50 |
| Comparative examples 6-10 | 46~48 |

As is clear from TABLE 3, it is confirmed that the luminous efficiency is improved in Examples 1 to 10.

Examples 11 to 15

The white-color light emitting modules were produced and evaluated similarly to Examples 1 to 5 except that an Eu activated alkaline earth orthosilicate phosphor was used as the green phosphor, the diameter r outside the red fluorescent layer was set to 120 μm, and the diameter D outside the intermediate layer was set to 505 μm. TABLE 4 illustrates the result. The diameter r and the diameter D satisfy the equation (2).

$$2.0r=240(\mu m) \leq D=505(\mu m) \leq r+1000=1120(\mu m)$$

Comparative Examples 11 to 15

The white-color light emitting modules were produced and evaluated similarly to Examples 6 to 10 except that the green fluorescent layer was directly formed on the red fluorescent layer while the intermediate layer was not formed. TABLE 4 illustrates the result.

Comparative Examples 16 to 20

The white-color light emitting modules were produced and evaluated similarly to Examples 6 to 10 except that the diameter D outside the intermediate layer was set to 2150 μm. TABLE 4 illustrates the result. The diameter r and the diameter D do not satisfy the equation (2).

$$2.0r=240(\mu m)\leq D=2150(\mu m)\geq r+1000=1120(\mu m)$$

TABLE 4

| | Luminous efficiency (lm/W) |
|---|---|
| Examples 11-15 | 54~56 |
| Comparative examples 11-15 | 51~53 |
| Comparative examples 16-20 | 48~50 |

As is clear from TABLE 4, it is confirmed that the luminous efficiency is improved in Examples 11 to 15.

Examples 16 to 20

The light emitting devices 20 of the second embodiment illustrated in FIG. 5, in which the near-ultraviolet LEDs were used as the light emitting element, were connected so as to become a 4-by-4 array illustrated in FIG. 6, and the anode electrode 60 and the cathode electrode 62 were formed.

The sialon phosphors having compositions of TABLE 1 were applied to the red phosphor, and the sialon phosphors were expressed by the composition formula of the following equation (8).

$$(Sr_{1-x1}Eu_{x1})_a Si_b AlO_c N_d \qquad (8)$$

The sialon phosphors having compositions of TABLE 2 were applied to the green phosphor, and the sialon phosphors were expressed by the composition formula of the following equation (9).

$$(Sr_{1-x2}Eu_{x2})_{3-y}Si_{13-z}Al_{3+z}O_{2+u}N_{21-w} \qquad (9)$$

(Sr, Ca, Ba)$_{10}$(PO$_4$)$_6$Cl$_2$:Eu$^{2+}$ was used as the blue phosphor.

The diameter r outside the red fluorescent layer was set to 95 μm, and the diameter D outside the intermediate layer was set to 320 μm. The diameter r and the diameter D satisfy the equation (2).

$$2.0r=190(\mu m)\leq D=320(\mu m)\leq r+1000=1095(\mu m)$$

Similarly to Examples 1 to 5, the white-color light emitting module was driven at 20 mA, and the luminous efficiency was evaluated by the total luminous flux using the integrating sphere. TABLE 5 illustrates the result.

Comparative Examples 21 to 25

The white-color light emitting modules were produced and evaluated similarly to Examples 11 to 15 except that the green fluorescent layer was directly formed on the red fluorescent layer while the intermediate layer was not formed. TABLE 5 illustrates the result.

Comparative Examples 26 to 30

The white-color light emitting modules were produced and evaluated similarly to Examples 11 to 15 except that the diameter D outside the intermediate layer was set to 1850 μm. TABLE 5 illustrates the result. The diameter r and the diameter D do not satisfy the equation (2).

$$2.0r=190(\mu m)\leq D=1850(\mu m)\geq r+1000=1095(\mu m)$$

TABLE 5

| | Luminous efficiency (lm/W) |
|---|---|
| Examples 16-20 | 47~49 |
| Comparative examples 21-25 | 42~44 |
| Comparative examples 26-30 | 39~41 |

As is clear from TABLE 5, it is confirmed that the luminous efficiency is improved in Examples 16 to 20.

Examples 21 to 25

The white-color light emitting modules were produced and evaluated similarly to Examples 11 to 15 except that the Eu activated alkaline earth orthosilicate phosphor was used as the green phosphor, the diameter r outside the red fluorescent layer was set to 130 μm, and the diameter D outside the intermediate layer was set to 450 μm. TABLE 6 illustrates the result. The diameter r and the diameter D satisfy the equation (2).

$$2.0r=260(\mu m)\leq D=450(\mu m)\leq r+1000=1130(\mu m)$$

Comparative Examples 31 to 35

The white-color light emitting modules were produced and evaluated similarly to Examples 16 to 20 except that the green fluorescent layer was directly formed on the red fluorescent layer while the intermediate layer was not formed. TABLE 6 illustrates the result.

Comparative Examples 36 to 40

The white-color light emitting modules were produced and evaluated similarly to Examples 16 to 20 except that the diameter D outside the intermediate layer was set to 2150 μm. TABLE 6 illustrates the result. The diameter r and the diameter D do not satisfy the equation (2).

$$2.0r=260(\mu m)\leq D=2150(\mu m)\geq r+1000=1130(\mu m)$$

TABLE 6

| | Luminous efficiency (lm/W) |
|---|---|
| Examples 21-25 | 47~49 |
| Comparative examples 31-35 | 41~43 |
| Comparative examples 36-40 | 37~39 |

As is clear from TABLE 6, it is confirmed that the luminous efficiency is improved in Examples 21 to 25.

What is claimed is:
1. A light emitting device comprising:
a board;
a light emitting element mounted on a principal surface of the board, the light emitting element emitting light having a wavelength of 250 nm to 500 nm;

a red fluorescent layer formed on the light emitting element, the red fluorescent layer including a red phosphor expressed by equation (1), an outer circumference of the red fluorescent layer having a semicircular shape with a radius r in a section perpendicular to the principal surface;

$$(M_{1-x1}Eu_{x1})_a Si_b AlO_c N_d \qquad (1)$$

in the equation (1), M is Sr (strontium) or Sr with an element less than or eqaul to 10 mol %, the element being selected from IA group elements, IIA group elements, IIIA group elements, IIIB group elements except Al (aluminum), rare-earth elements, and IVB group elements, and x1, a, b, c, and d satisfy the following relationship:

$$0<x1<1,$$

$$0.55<a<0.95,$$

$$2.0<b<3.9,$$

$$0<c<0.6,$$

$$4<d<5.7,$$

an intermediate layer formed on the red fluorescent layer, the intermediate layer being made of transparent resin, an outer circumference of the intermediate layer having a semicircular shape with a radius D in a section perpendicular to the principal surface; and a green fluorescent layer formed on the intermediate layer, the green fluorescent layer including a green phosphor, an outer circumference of the green fluorescent layer having a semicircular shape in a section perpendicular to the principal surface, wherein a relationship between the radius r and the radius D satisfies equation (2):

$$2.0r(\mu m) \leq D \leq (r+1000)(\mu m) \qquad (2) \text{ and}$$

wherein a luminous flux loss $\gamma$ is 5% or less, expressed by equation (5), $$\gamma = \beta \delta (1-(1-(r/D)^2)^{-1/2})) \qquad (5)$$

in which $\beta$ is a product of absorptance of green light by the red phosphor, $\delta$ is a luminous factor difference between green light emitted by the green phosphor and red light emitted by the red phosphor.

2. The device according to claim 1, wherein the green phosphor has a compsition expressed by equation (3):

$$(M'_{1-x2}Eu_{x2})_{3-y} Si_{13-z} Al_{3+z} O_{2+u} N_{21-w} \qquad (3)$$

in the equation (3), M' is Sr (strontium) or Sr with an element less than or eqaul to 10 mol %, the element being selected from IA group elements, IIA group elements, IIIA group elements, IIIB group elements except Al (aluminum), rare-earth elements, and IVB group elements, and x2, y, z, u, and w satisfy the following relationship:

$$0<x2<1,$$

$$-0.1<y<0.3,$$

$$-3<z\leq 1,$$

$$-3<u-w\leq 1.5.$$

3. The device according to claim 1, wherein the green phosphor is an Eu activated alkaline earth orthosilicate phosphor.

4. The device according to claim 1, wherein the light emitting element is a blue LED.

5. The device according to claim 1, wherein the transparent resin is a silicone resin.

6. The device according to claim 1, wherein the element M is strontium (Sr).

7. The device according to claim 2, wherein the element M' is strontium (Sr).

8. The device according to claim 1, further comprising an outer surface layer made of a transparent resin, the outer surface layer being formed on the green fluorescent layer.

9. The device according to claim 1, further comprising a yellow fluorescent layer including a yellow phosphor, the yellow fluorescent layer being formed between the red fluorescent layer and the intermediate layer.

\* \* \* \* \*